United States Patent [19]

Tanaka et al.

[11] Patent Number: 5,292,718
[45] Date of Patent: Mar. 8, 1994

[54] PROCESS FOR PREPARING SUPERCONDUCTING JUNCTION OF OXIDE SUPERCONDUCTOR

[75] Inventors: Saburo Tanaka; Hidenori Nakanishi; Hideo Itozaki; Takashi Matsuura, all of Itami, Japan

[73] Assignee: Sumitomo Electric Industries, Ltd., Osaka, Japan

[21] Appl. No.: 957,639

[22] Filed: Oct. 6, 1992

Related U.S. Application Data

[63] Continuation of Ser. No. 707,374, May 30, 1991, abandoned.

[30] Foreign Application Priority Data

May 30, 1990 [JP] Japan .................. 2-140516
Jun. 4, 1990 [JP] Japan .................. 2-145936

[51] Int. Cl.$^5$ .................. B05D 5/12; H01L 39/24
[52] U.S. Cl. .................. 505/1; 505/701; 505/702; 505/731; 505/732; 505/730; 427/62; 427/314; 427/419.2; 427/419.3; 427/255.7; 257/33
[58] Field of Search .................. 505/1, 701, 702, 731, 505/732, 730; 427/62, 63, 314, 419.2, 419.3, 255.7; 257/33

[56] References Cited

U.S. PATENT DOCUMENTS

5,061,687 10/1991 Takada et al. .................. 505/1

FOREIGN PATENT DOCUMENTS

0371481 6/1990 European Pat. Off. .
0445350 9/1991 European Pat. Off. .
63-261770 10/1988 Japan .................. 505/702

OTHER PUBLICATIONS

Chang et al, "Microstructure of epitaxial $ErBa_2Cu_3O_{7-x}$ thin films grown on MgO(100) Substrates by rf magnetron sputtering", Appl. Phys. Lett. 54(23) Jun. 1989, pp. 2349-2351.

Eom et al, "Epitaxial and Smooth Films of a-Axis $YBa_2Cu_3O_7$", Science, vol. 249, Sep. 1990 pp. 1549-1552.

IBM Technical Disclosure Bulletin, vol. 32 No. 6A, Nov. 1989 p. 288.

J. J. Kingston et al., "Multilayer $YBa_2Cu_3O_x$-$SrTiO_3$-$YBa_2Cu_3O_x$ films for insulating crossovers" Applied Physics Letters vol. 56, No. 2, Jan. 8, 1990, New York, US pp. 189-191.

Tidjani M. E. et al., "Heteroepitaxial $YBa_2Cu_3O_{7-x}$-$SrTiO_3$-$YBa_2Cu_3O_{7-x}$ trilayers examined by transmission electron microscopy" Applied Physics Letters vol. 58, No. 18, Feb. 18, 1991, pp. 765-767 New York, US.

"High Tc superconducting oxide sandwich structures and tunnel junctions" IBM Technical Disclosure Bulletin vol. 31, No. 9, Feb. 1989, p. 217, New York, US.

*Primary Examiner*—Roy King

[57] ABSTRACT

Improvement in a process for fabricating a superconducting junction by depositing successively a first oxide superconductor thin layer, a non-superconducting intermediate thin film layer and a second oxide superconductor thin film layer on a substrate in this order.

In the invention, the non-superconducting intermediate thin film layer is composed of MgO and the substrate is preheated at 600°-650° C. for at least 5 minutes in the presence of $O_2$, and is heated at a temperature between 200° and 400° C. during the non-superconducting intermediate thin film layer is deposited.

14 Claims, 3 Drawing Sheets

2 SECOND OXIDE SUPERCONDUCTOR LAYER
3 MgO LAYER
1 FIRST OXIDE SUPERCONDUCTOR LAYER
4 SUBSTRATE

PROCESS FOR PREPARING SUPERCONDUCTING JUNCTION OF OXIDE SUPERCONDUCTOR

This is a continuation of application Ser. No. 07/707,374, filed May 30, 1991 now abandoned.

BACKGROUND OF THE INVENTION

1. Field of the Invention

The present invention relates to a process for preparing superconducting junctions of oxide superconductor such as Josephson Junction, more particularly to a process for preparing a superconducting junction by depositing successively a first oxide superconductor thin film layer, a non-superconducting intermediate thin film layer and a second oxide superconductor thin film layer on a substrate in this order.

2. Description of the Related Art

In order to realize electronics devices such as Josephson element or superconducting transistors in which superconductor is combined with semiconductor, it is indispensable to deposit successively at least one thin film layer of superconductor and at least one thin film layer of non-superconductor on a substrate. Hereinafter, we will describe the present invention with reference to Josephson junction used for fabricating Josephson element but it is apparent that the process according to the present invention is applicable to the other type superconducting devices.

A variations of Josephson Junctions have been reported. Among them, the most simplest type is so-called tunnel Josephson Junction in which a non-superconducting thin film layer is sandwiched between a pair of superconductors. Tunnel type Josephson element is fabricated by processing microscopically a layered structure of 1st superconductor thin film layer/non-superconductor thin film layer/2nd superconductor thin film layer. In this Josephson Junction, thickness of the intermediate thin film layer of non-superconducting is determined by the coherent length of superconductors.

Although several ideas for fabricating the tunnel type superconducting junctions from metallic superconductors have been reported, there is little report describing how to fabricate the same from oxide superconductors because there remain following problems to be solved in order to prepare the tunnel type superconducting junctions having oxide superconductor thin film layers.

Firstly, in the case of tunnel type superconducting junctions having oxide superconductor thin film layers, the thickness of non-superconducting intermediate thin film layer must be reduced to several nanometers (nm) because of very short coherent length of oxide superconductor.

Secondly, it is difficult to deposit and/or laminate oxide thin films having good crystallinity successively. In particular, in the prior art, it is difficult to prepare an upper superconductor thin film layer having good crystallinity on a non-superconducting intermediate thin film layer due to very poor crystallinity of the later layer. In order to improve performance of superconducting thin film devices, it is preferable that all thin film layers are made of single crystals. In fact, if any one of the layers is of a polycrystal or amorphous film, the tunnel type Josephson Junction doesn't work stably. In other words, there is a strong demand to prepare the second or upper superconductor thin film layer of single crystal having good crystallinity on a non-superconducting intermediate layer. Deposition of oxide superconductor thin film layer of single crystal having good crystallinity is requested also in the field of superconducting transistor having an interface between oxide superconductor and semiconductor.

In fact, tunnel type superconducting junctions prepared from oxide superconductor by the conventional technique did not show desired electrical properties due to poor interface condition between the oxide superconductor thin film layer and the non-superconductor thin film layer.

Therefore, an object of the present invention is to solve the problems and to provide a process for improving crystallinity of the non-superconducting intermediate thin film layer and hence the second or upper superconducting thin film layer in order to permit high-temperature superconductors to be utilized in actual uses.

SUMMARY OF THE INVENTION

The present invention provides a process for fabricating a superconducting junction by depositing successively a first oxide superconductor thin film layer, a non-superconducting intermediate thin film layer and a second oxide superconductor thin film layer on a substrate in this order, characterized in that the non-superconducting intermediate thin film layer is composed of MgO and in that said substrate is heated at a temperature between 200° and 400° C. during the non-superconducting intermediate thin film layer is deposited.

The present invention provides also a process for fabricating a superconducting junction by depositing successively a first oxide superconductor thin layer, a non-superconducting intermediate thin film layer and a second oxide superconductor thin film layer on a substrate in this order, characterized in that, before the non-superconducting intermediate layer is deposited, the substrate on which the first oxide superconductor thin film layer has been deposited previously is heated at a temperature between 600° and 650° C. In this case, the material of non-superconducting intermediate thin film layer is not limited to MgO.

Figure 1:
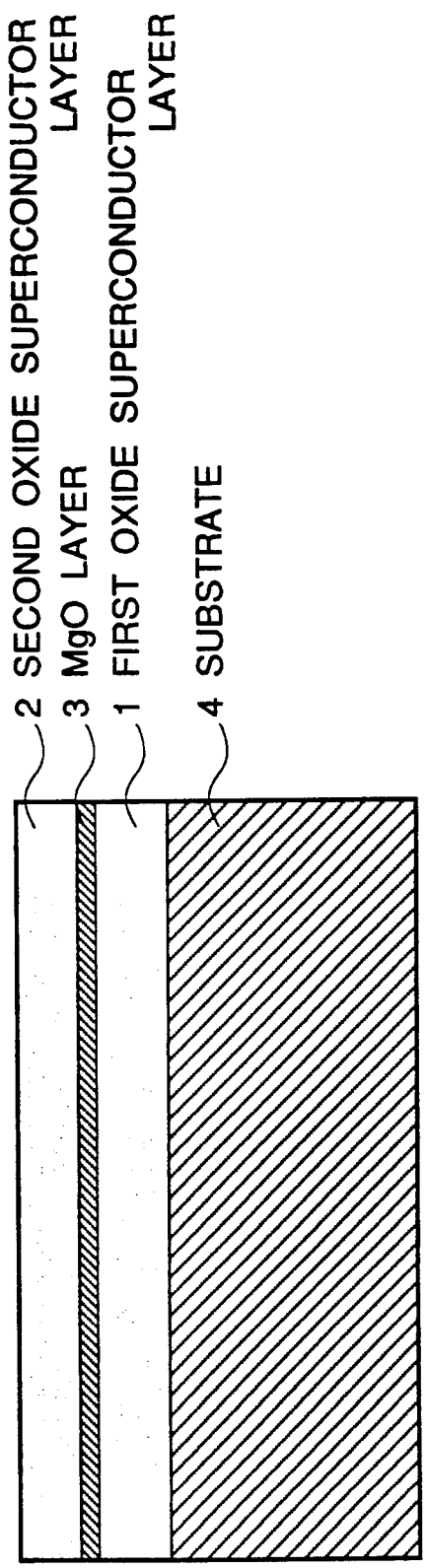
FIG. 1 is a diagrammatical cross sectional view of a product obtained by the process according to the present invention.

As is illustrated in FIG. 1, the superconducting junction prepared by the process according to the present invention has a layered structure consisting of a first oxide superconductor thin film layer (1), a non-superconducting intermediate thin film layer (3) and a second oxide superconductor thin film layer (2) deposited on a substrate (4) in this order.

The first feature of the present invention reside in that the substrate is heated at a temperature between 200° and 400° C. during the non-superconducting intermediate thin film layer of MgO is deposited. If the substrate temperature is not heated higher than 200° C., the resulting thin film layer of MgO possesses poor crystallinity or becomes amorphous. To the contrary, if the substrate temperature is heated above 400° C., the resulting thin film layer of MgO becomes polycrystal. In both cases, no desired superconducting junction can not be obtained.

Thickness of the MgO thin film layer is also important in the process according to the present invention and is preferably between 1 and 10 nm. If the thickness of the MgO thin film layer is not thicker than 1 nm, it is difficult to form a uniform thin film of MgO and the crystallinity of the thin film become poor. To the contrary, if the thickness of MgO thin film layer exceed 10 nm, it is also difficult to deposit a well-ordered second superconductor thin film layer thereon because the crystallinity of MgO thin film layer is disturbed and a desired coherent length can not be obtained.

All of the first and second oxide superconductor thin film layers and the non-superconducting intermediate thin film layer can be prepared by any known technique but are prepared preferably by physical vapour deposition method including sputtering method, vacuum evaporation method and molecular beam epitaxy method. Chemical vapour deposition method also may be used.

In a preferred embodiment of the present invention, the first oxide superconductor thin film layer is prepared by sputtering, vacuum evaporation and molecular beam epitaxy and both of the non-superconducting intermediate thin film layer and the second oxide superconductor thin film layer are prepared by vacuum evaporation method which give no bad influence to an under-layer.

The second feature of the present invention reside in that the orientation directions of the first and second superconducting thin film layers can be made identical to each other. In fact, when the first superconducting thin film layer is a c-axis oriented film, the second superconducting thin film layer deposited thereon becomes also a c-axis oriented film, and, when the first superconducting thin film layer is an a-axis oriented film, the second superconducting thin film layer deposited thereon becomes also an a-axis oriented film. Selection of orientation can be made according to applications. Orientation of superconducting thin film layers can be changed by controlling the substrate temperature during deposition. For example, in the case of a thin film layer of Y—Ba—Cu—O system deposited on a single crystal of MgO (100) by sputtering method, c-axis oriented superconducting thin film is obtained at a substrate temperature of 630° C., while a-axis oriented superconducting thin film is obtained at a substrate temperature of 600° C.

The first and second oxide superconductor thin film layers are preferably made of a compound oxide selected from the group comprising Y—Ba—Cu—O system such as $Y_1Ba_2Cu_3O_{7-x}$, Bi—Sr—Ca—Cu—O system such as $Bi_2Sr_2Ca_2Cu_3O_x$ and Tl—Ba—Ca—Cu—O system such as $Tl_2Ba_2Ca_2Cu_3O_x$. $Y_1Ba_2Cu_3O_{7-x}$ is preferable because thin films of high quality are obtainable stably and $Tl_2Ba_2Ca_2Cu_3O_x$ is also preferable due to its high critical temperature (Tc).

The substrate is not limited but is preferably a single crystal substrate of oxide such as MgO, $SrTiO_3$, $LaAlO_3$, $LaGaO_3$ and yttrium stabilized zirconia (YSZ). The first oxide superconductor thin film layer is deposited preferably on a (100) plane of a single crystal substrate of MgO.

In a preferred embodiment according to the present invention, the substrate on which the first oxide superconductor thin film layer has been deposited previously is heated at a temperature between 600° and 650° C., before and the non-superconducting intermediate thin film layer is deposited. By this heat-treatment, a surface of the thin film layer of MgO is cleaned and the quality of the second superconducting thin film layer is improved.

This heat-treatment is effected preferably in oxygen containing atmosphere.

Inventors of this application found that this technique is not limited to the thin film layer of MgO but is applicable to the other non-superconducting intermediate layers such as $SrTiO_3$, $LaAlO_3$ or $LaGaO_3$.

In particular, this heat-treatment technique is advantageous in such a case when the intermediate layer is prepared by a different method from that is used for depositing the first superconducting thin film layer. For example, when first superconducting thin film layer is prepared by sputtering method while the intermediate layer and/or the second superconducting thin film layer are prepared by vacuum evaporation method, a substrate on which first superconducting thin film layer is deposited is transferred from a chamber of sputtering unit to another chamber of vacuum evaporation unit. The surface of the first superconducting thin film layer is exposed to atmosphere and may be deteriorated during the transfer. Such spoiled surface can be cleaned by the heat-treatment technique according to the present invention.

When a temperature of this heat-treatment is not higher than 600° C., effective cleaning can not be expected. To the contrary, if the temperature of this heat-treatment exceeds over 650° C., the first superconducting thin film layer is deteriorated due to migration of substrate material into the superconducting thin film layer and recrystallization of the later. This heat-treatment is preferably carried out for more than 5 minutes.

The other operational condition except the temperature during the heat-treatment can be identical with those used in the above-mentioned case.

In conclusion, the process according to the present invention has following advantages:
(1) A thin film of high quality can be deposited on an oxide superconducting thin film layer.
(2) Tunnel type superconducting junction which is an indispensable element for realizing electronics devices can be obtained.
(3) Orientation of crystals can be controlled freely, so that the critical current density can be flown in parallel with (c-axis oriented film) or perpendicular to (a-axis oriented film) a surface of the substrate.

DESCRIPTION OF THE PREFERRED EMBODIMENTS

Now, the present invention will be described with reference to Examples, but the scope of the present invention should not be limited thereto.

EXAMPLE 1

A first, a superconducting thin film layer having a composition of $Y_1Ba_2Cu_3O_{7-x}$ was deposited on a (100) plane of a MgO single crystal by RF-magnetron sputtering.

In this Example, both of c-axis oriented and a-axis oriented thin films of superconductors of $Y_1Ba_2Cu_3O_{7-x}$ were prepared by changing the substrate temperature.

Essential operational conditions used for preparing the first oxide superconducting thin film layer are as following:

| Substrate temperature: | 630° C. for c-axis oriented film |
| --- | --- |
| | 600° C. for a-axis oriented film |
| Sputtering gas: | Ar: 8 sccm |
| | $O_2$: 4 sccm |
| Gas pressure: | $5 \times 10^{-2}$ Torr |
| Thickness of 1 st layer: | 300 nm |

The resulting substrate having the first oxide superconducting thin film layer was transferred from a sputtering chamber to a vacuum evaporation chamber and then a non-superconducting intermediate thin film layer of MgO was deposited on the first oxide superconducting thin film layer by vacuum evaporation method. Essential operational conditions used for preparing the MgO layer are as following:

| Substrate temperature: | 400° C. |
| --- | --- |
| Gas pressure: | $4 \times 10^{-4}$ Torr |
| Thickness of MgO: | 5 nm |

Then, in the same chamber, a second oxide superconducting thin film layer of $Y_1Ba_2Cu_3O_{7-x}$ was deposited on the resulting MgO thin film layer by vacuum deposition method. Essential operational conditions used for preparing the 2nd layer are as following:

| Substrate temperature: | 630° C. |
| --- | --- |
| Gas pressure: | $4 \times 10^{-4}$ Torr |
| Thickness of 2nd layer: | 200 nm |

It was confirmed, by a scanning electron microscopy (SEM), such a fact that, when the first oxide superconducting thin film layer was a c-axis oriented film of $Y_1Ba_2Cu_3O_{7-x}$, the second oxide superconducting thin film layer deposited thereon through MgO thin film layer became also a c-axis oriented film of $Y_1Ba_2Cu_3O_{7-x}$, and, when the first oxide superconducting thin film layer was an a-axis oriented film, the second oxide superconducting thin film layer deposited thereon through MgO thin film layer became also an a-axis oriented film.

Figure 2A:
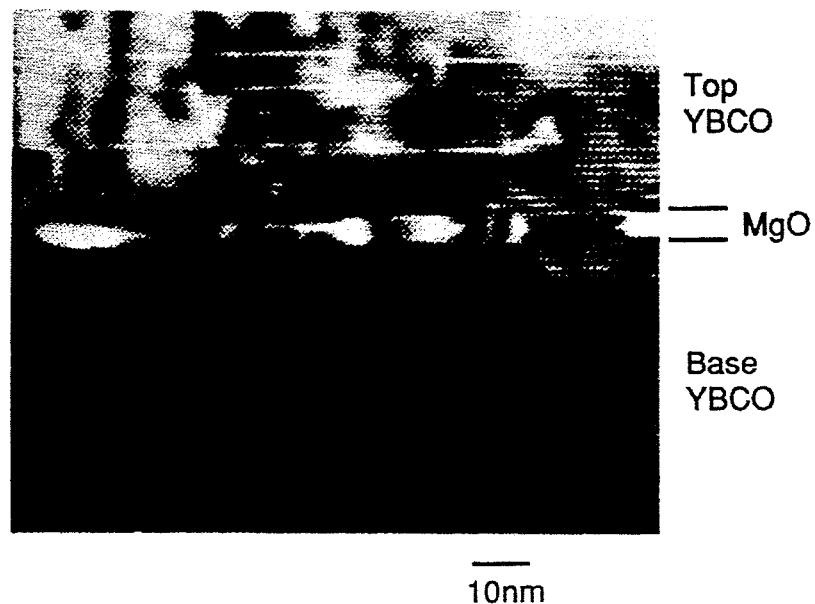
FIG. 2A and 2B are photos taken by a scanning electron spectroscopy (SEM) on cross sections of products prepared in Example 1 according to the present invention.

FIG. 2A is a photo taken by a scanning electron spectroscopy (SEM) on a cross section of the resulting layered structure of $Y_1Ba_2Cu_3O_{7-x}/MgO/Y_1Ba_2Cu_3O_{7-x}$ in which both of the 1st and 2nd oxide superconducting thin film layers were c-axis oriented films.

Figure 2B:
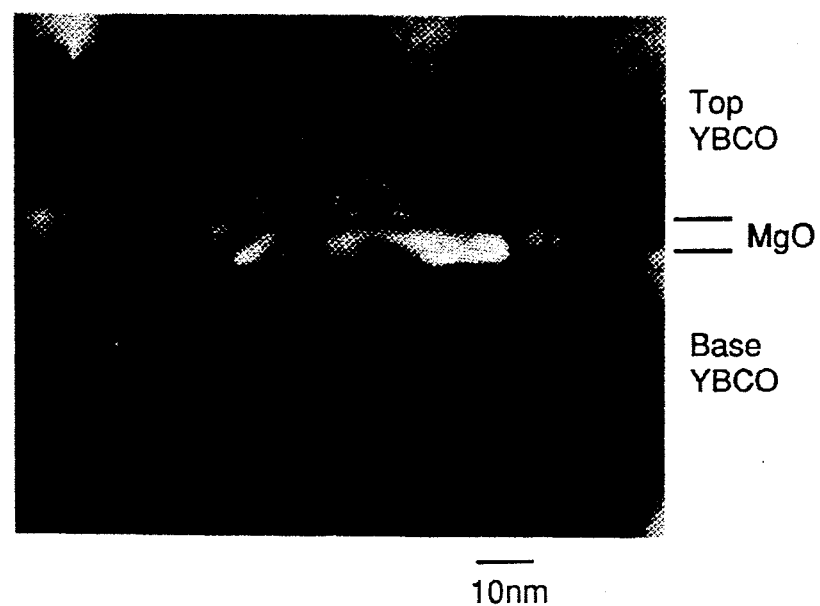

FIG. 2B is a photo taken by a scanning electron spectroscopy (SEM) on a cross section of the resulting layered structure of $Y_1Ba_2Cu_3O_{7-x}/MgO/Y_1Ba_2Cu_3O_{7-x}$ in which both of the 1st and 2nd oxide superconducting thin film layers were a-axis oriented films.

FIG. 2A and 2B reveal such facts that crystals of $Y_1Ba_2Cu_3O_{7-x}$ in the first and second oxide superconducting thin film layers were oriented along an identical direction in the superconducting junctions prepared by the process according to the present invention and that an interface between MgO intermediate thin film layer and first/second oxide superconducting thin film layer is very sharp and has so serious disorder.

EXAMPLE 2

The same procedure as Example 1 was repeated but first/second oxide superconducting thin film layers of $Y_1Ba_2Cu_3O_{7-x}$ were replaced by $Bi_2Sr_2Ca_2Cu_3O_x$.

Essential operational conditions used for preparing the first oxide superconducting thin film layer are as following:

| Substrate temperature: | 660° C. for c-axis oriented film |
| --- | --- |
| | 630° C. for a-axis oriented film |
| Sputtering gas: | Ar: 8 sccm |
| | $O_2$: 4 sccm |
| Gas pressure: | $5 \times 10^{-2}$ Torr |
| Thickness of 1 st layer: | 300 nm |

Essential operational conditions used for preparing the MgO layer are as following:

| Substrate temperature: | 400° C. |
| --- | --- |
| Gas pressure: | $4 \times 10^{-4}$ Torr |
| Thickness of MgO: | 5 nm |

Then, in the same chamber, a second oxide superconducting thin film layer of $Bi_2Sr_2Ca_2Cu_3O_x$ was deposited on the resulting MgO thin film layer by vacuum deposition method. Essential operational conditions used for preparing the 2nd layer are as following:

| Substrate temperature: | 660° C. |
| --- | --- |
| Gas pressure: | $4 \times 10^{-4}$ Torr |
| Thickness of 2nd layer: | 200 nm |

In this Example also, it was confirmed, by a scanning electron microscopy (SEM), such facts that, when the first oxide superconducting thin film layer was a c-axis oriented film of $Bi_2Sr_2Ca_2Cu_3O_x$, the second oxide superconducting thin film layer deposited thereon through MgO thin film layer became also a c-axis oriented film of $Bi_2Sr_2Ca_2Cu_3O_x$, and, when the first oxide superconducting thin film layer was an a-axis oriented film, the second oxide superconducting thin film layer deposited thereon through MgO thin film layer became also an a-axis oriented film and that crystals of $Bi_2Sr_2Ca_2Cu_3O_x$ in the first and second oxide superconducting thin film layers were oriented along an identical direction in the superconducting junctions and also that an interface between MgO intermediate thin film layer and first/second oxide superconducting thin film layer was very sharp and had so serious disorder.

EXAMPLE 3

The same procedure as Example 1 was repeated but the substrate temperature for depositing the intermediate thin film layer of MgO was modified.

Figure 3:
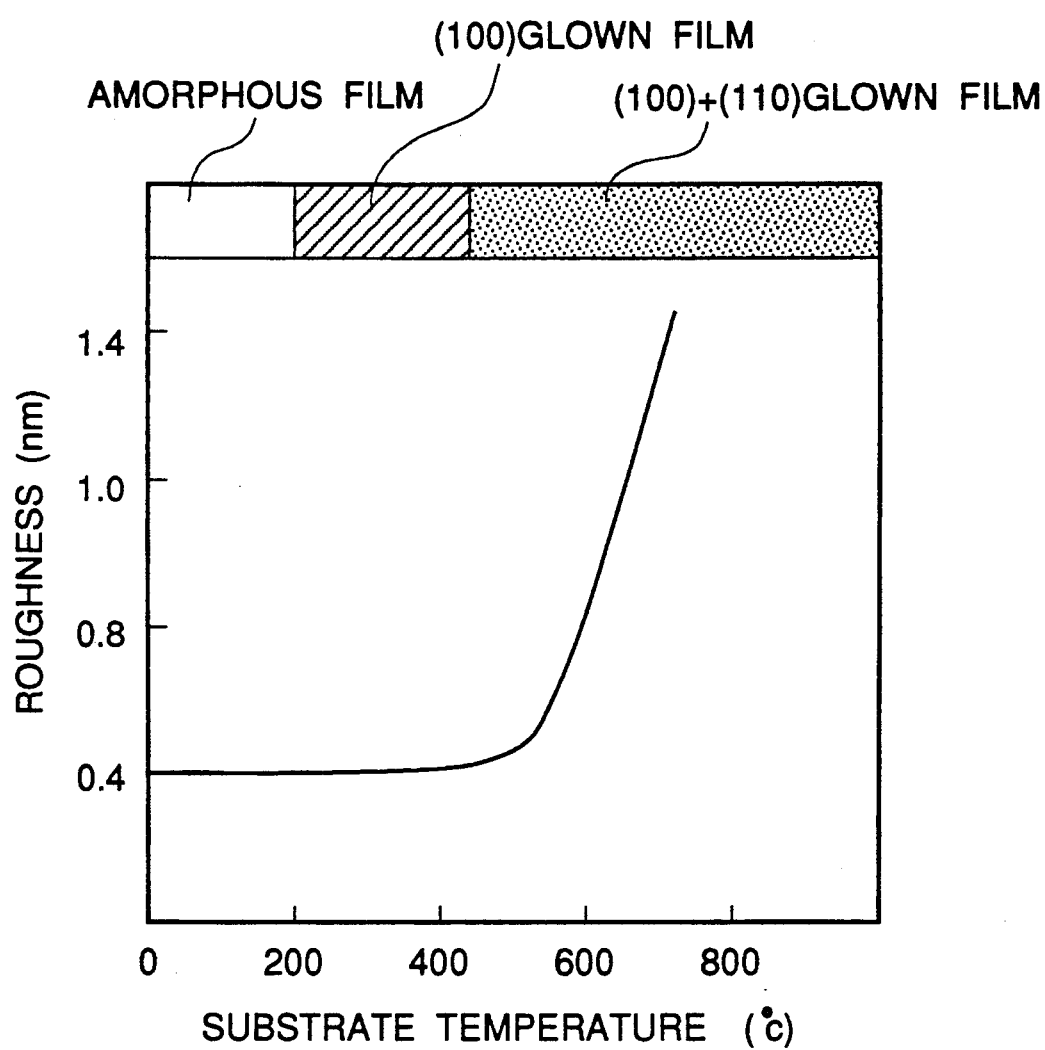
FIG. 3 illustrates substrate temperature dependency of surface roughness and of crystal orientation in an intermediate thin film layer of MgO deposited on a first oxide superconducting thin film layer of $Y_1Ba_2Cu_3O_{7-x}$ prepared in Example 3 according to the present invention.

The results are summarized in FIG. 3 which illustrates substrate temperature dependency of surface roughness and of crystal orientation in an intermediate thin film layer of MgO deposited on a first oxide superconducting thin film layer of $Y_1Ba_2Cu_3O_{7-x}$.

FIG. 3 reveals such a fact that intermediate non-superconducting thin film layers of MgO deposited on the first oxide superconducting thin film layer of $Y_1Ba_2Cu_3O_{7-x}$ show uneven or rough surface at substrate temperatures of higher than 400° C. and become amorphous at substrate temperatures of lower than 200° C.

FIG. 3 reveals such a fact also that the intermediate non-superconducting thin film layers of MgO contains (110) plane on its surface on which the second superconducting thin film layer will be deposited, in addition to (100) plane. Such mixed planes result in deterioration of crystallinity.

From the result, it was confirmed that it is indispensable to limit the substrate temperature between 200° C. and 400° C. in order to realize a smooth (100) plane possessing improved crystallinity which is an indispensable condition to produce the second oxide superconducting thin film layer having the same deposition plane as the first oxide superconducting thin film layer.

EXAMPLE 4

In this Example, a first oxide superconducting thin film layer was heat-treated previously before an intermediate non-superconducting thin film layer was deposited.

A first, a superconducting thin film layer having a composition of $Y_1Ba_2Cu_3O_{7-x}$ was deposited on a (100) plane of a MgO single crystal by RF-magnetron sputtering.

Essential operational conditions used for preparing the first oxide superconducting thin film layer are as following:

| | |
|---|---|
| Substrate temperature: | 630° C. for c-axis oriented film |
| Sputtering gas: | Ar: 8 sccm |
| | $O_2$: 4 sccm |
| Gas pressure: | $5 \times 10^{-2}$ Torr |
| Thickness of 1 st layer: | 300 nm |

The resulting substrate having the first oxide superconducting thin film layer was transferred from a sputtering chamber to a vacuum evaporation chamber.

In the vacuum evaporation chamber, the heat-treatment was effected with supplying oxygen gas through a nozzle onto a surface of the substrate for 30 minutes, under following condition:

| | |
|---|---|
| Substrate temperature: | 600° C. for c-axis oriented film |
| Surrounding gas: | $O_2$ |
| Gas pressure: | $4 \times 10^{-4}$ Torr |

(This value is a pressure in the vacuum evaporation chamber but is not a pressure around the substrate where gas pressure may be one to two orders ($10^{-3}$ to $10^{-2}$) higher than this value)

Then, the substrate was left to be cooled down to 400° C.

After then, a non-superconducting intermediate thin film layer of MgO was deposited on the heat-treated first oxide superconducting thin film layer by vacuum evaporation method. Essential operational conditions used for preparing the MgO layer are as following:

| | |
|---|---|
| Substrate temperature: | 400° C. |
| Gas pressure: | $4 \times 10^{-4}$ Torr |
| Thickness of MgO: | 5 nm |

Then, in the same chamber, a second oxide superconducting thin film layer of $Y_1Ba_2Cu_3O_{7-x}$ was deposited on the resulting MgO thin film layer by vacuum deposition method. Essential operational conditions used for preparing the 2nd layer are as following:

| | |
|---|---|
| Substrate temperature: | 630° C. |
| Gas pressure: | $4 \times 10^{-4}$ Torr |
| Thickness of 2nd layer: | 200 nm |

By a scanning electron microscopy (SEM), it was confirmed such facts that an interface between MgO intermediate thin film layer and first/second oxide superconducting thin film layer was very sharp and that disorder of crystals at the interface was less than 1 nm in width.

In a comparative example which was not subjected to the heat-treatment, disorder of crystals in width at the interface of 5 to 10 nm was observed.

EXAMPLE 5

The same procedure as Example 4 was repeated but first/second oxide superconducting thin film layers of $Y_1Ba_2Cu_3O_{7-x}$ were replaced by $Bi_2Sr_2Ca_2Cu_3O_x$.

Essential operational conditions used for preparing the first oxide superconducting thin film layer are as following:

| | |
|---|---|
| Substrate temperature: | 660° C. for c-axis oriented film |
| Sputtering gas: | Ar: 8 sccm |
| | $O_2$: 4 sccm |
| Gas pressure: | $5 \times 10^{-2}$ Torr |
| Thickness of 1 st layer: | 300 nm |

Heat-treatment was effected for 30 minutes under following conditions:

| | |
|---|---|
| Substrate temperature: | 600° C. for c-axis oriented film |
| Surrounding gas: | $O_2$ |
| Gas pressure: | $4 \times 10^{-4}$ Torr |

Essential operational conditions used for preparing the MgO layer are as following:

| | |
|---|---|
| Substrate temperature: | 400° C. |
| Gas pressure: | $4 \times 10^{-4}$ Torr |
| Thickness of MgO: | 5 nm |

Then, in the same chamber, a second oxide superconducting thin film layer of $Bi_2Sr_2Ca_2Cu_3O_x$ was deposited on the resulting MgO thin film layer by vacuum deposition method. Essential operational conditions used for preparing the 2nd layer are as following:

| | |
|---|---|
| Substrate temperature: | 650° C. |
| Gas pressure: | $4 \times 10^{-4}$ Torr |
| Thickness of 2nd layer: | 300 nm |

By a scanning electron microscopy (SEM), it was confirmed such facts that an interface between MgO intermediate thin film layer and first/second oxide superconducting thin film layer was very sharp and that no substantial disorder of crystals at the interface was observed.

In a comparative example which was not subjected to the heat-treatment, disorder of crystals in width at the interface of 5 to 10 nm was observed.

EXAMPLE 6

The same procedure as Example 4 was repeated but non-superconducting thin film of MgO was replaced by SrTiO$_3$ and deposition of this non-superconducting thin film of SrTiO$_3$ was effected under following conditions:

| | |
|---|---|
| Substrate temperature: | 610° C. |
| Gas pressure: | $4 \times 10^{-4}$ Torr |
| Thickness of SrTiO$_3$: | 5 nm |

By a scanning electron microscopy (SEM), it was confirmed such facts that an interface between SrTiO$_3$ intermediate thin film layer and first/second oxide superconducting thin film layer was very sharp and that disorder of crystals at the interface was less than 1 nm in width.

We claim:

1. A process for fabricating a superconducting junction by depositing successively a first oxide superconductor thin film layer, a non-superconducting intermediate thin film layer having a thickness between 1 and 10 nm and a second oxide superconductor thin film layer on a substrate in this order, wherein before said non-superconducting intermediate layer is deposited, said substrate on which said first oxide superconductor thin film layer has been deposited previously is heated at a temperature between 600° and 650° C. for at least 5 minutes in the presence of oxygen and in that said first oxide superconductor thin film layer is deposited in a different deposition chamber from said non-superconducting intermediate layer and wherein said substrate on which said first oxide superconductor thin film layer has been previously deposited is heated at a temperature between 200° and 400° C. during said deposition of said non-superconducting intermediate thin film layer.

2. The process set forth in claim 1 wherein said non-superconducting intermediate thin film layer is composed of SrTiO$_3$.

3. The process set forth in claim 2 wherein both of said non-superconducting intermediate thin film layer and said second oxide superconductor thin film layer are prepared by vacuum deposition method.

4. The process set forth in claim 2 wherein said first thin film layer is a-axis oriented thin film or c-axis oriented thin film.

5. The process set forth in claim 2 wherein first and second oxide superconductor thin film layers are made of a compound oxide selected from the group consisting of Y-Ba-Cu-O system, Bi-Sr-Ca-Cu-O system and Tl-Ba-Ca-Cu-O system.

6. The process set forth in claim 2 wherein said substrate is a single crystal substrate of oxide selected from the group consisting of MgO, SrTiO$_3$, LaAlO$_3$, LaGaO$_3$ and yttrium stabilized zirconia (YSZ).

7. The process set forth in claim 6 wherein said first oxide superconductor thin film layer is deposited on a (100) plane of a single crystal substrate of MgO.

8. A process for producing a superconducting junction comprising the steps of:

depositing on a substrate a first oxide superconductor thin film layer having an axis oriented with respect to the substrate;

heating the substrate to a temperature of from 600° to 650° C. at least 5 minutes in the presence of oxygen;

depositing on the first oxide superconductor thin film layer a non-superconducting intermediate layer having a thickness of from 1 to 10 nm; wherein said first oxide superconductor thin film layer is deposited in a different deposition chamber from said non-superconducting intermediate layer;

depositing on the intermediate layer a second oxide superconductor thin film layer; and orienting the second oxide superconductor thin film layer to the same orientation as the first oxide superconductor layer by heating the substrate to a temperature of from 200° C. to 400° C. during the deposition of the intermediate layer.

9. The process set forth in claim 8 wherein the intermediate layer is comprised of SrTiO$_3$.

10. The process set forth in claim 9 comprising depositing the first oxide superconductor thin film layer and the second oxide superconductor thin film layer by a vacuum deposition method.

11. The process set forth in claim 1 wherein the first oxide superconductor thin film layer is a-axis or c-axis oriented.

12. The process set forth in claim 9 wherein the first and second oxide superconductor thin film layers are a compound oxide selected from the group consisting of Y-Ba-Cu-O system, Bi-Sr-Ca-Cu-O system and Tl-Ba-Ca-Cu-O system.

13. The process set forth in claim 9 wherein the substrate is selected from the group consisting of MgO, SrTiO$_3$, LaAlO$_3$, LaGaO$_3$ and yttrium stabilized zirconia (YSZ).

14. The process set forth in claim 13 comprising depositing the first oxide superconductor thin film layer on a (100) plane of an MgO single crystal substrate.

* * * * *